United States Patent
Guldi et al.

(10) Patent No.: US 6,572,461 B2
(45) Date of Patent: Jun. 3, 2003

(54) METHOD FOR PRODUCING WAFER NOTCHES WITH ROUNDED CORNERS AND A TOOL THEREFOR

(75) Inventors: Richard L. Guldi, Dallas, TX (US); James F. Garvin, Jr., Carrollton, TX (US); Moitreyee Mukerjee-Roy, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 166 days.

(21) Appl. No.: 09/781,446

(22) Filed: Feb. 13, 2001

(65) Prior Publication Data

US 2001/0008154 A1 Jul. 19, 2001

Related U.S. Application Data

(62) Division of application No. 09/289,499, filed on Apr. 9, 1999, now Pat. No. 6,448,154.
(60) Provisional application No. 60/081,986, filed on Apr. 16, 1998.

(51) Int. Cl.[7] .............................. B24B 7/00; B24B 9/00
(52) U.S. Cl. ............................ 451/259; 51/293; 451/41
(58) Field of Search .......................... 51/293; 257/797; 438/462, 975; 451/28, 41, 44, 259–293

(56) References Cited

U.S. PATENT DOCUMENTS

| | | | |
|---|---|---|---|
| 4,905,425 A | 3/1990 | Sekigawa et al. | 51/283 R |
| 5,289,661 A | 3/1994 | Jones et al. | 51/283 E |
| 5,445,554 A | 8/1995 | Hosokawa | 451/11 |
| 5,458,529 A | 10/1995 | Hasegawa et al. | 451/177 |

*Primary Examiner*—Wael Fabmy
*Assistant Examiner*—Marcos D. Pizarro-Crespo
(74) *Attorney, Agent, or Firm*—Wade James Brady, III; Frederick J. Telecky, Jr.

(57) ABSTRACT

A semiconductor wafer for use in the fabrication of semiconductor devices which includes a circular wafer (13) of semiconductor material having a perimeter and a notch (11) having a wall disposed in the wafer and extending to the perimeter which includes a preferably rounded apex (5) interior of the perimeter and a pair of rounded intersections (7, 9) between the wall and the perimeter. The notch is formed with a tool (23) for forming rounded corners in the semiconductor wafer which includes a body of a material having a hardness greater than the semiconductor wafer which has a generally rounded or paraboloidally shaped front portion having a forwardmost tip (25) portion and a wing portion (27) extending outwardly from the body and having a taper narrowing in the direction of the forwardmost tip portion. The wing portion can be one or more spaced apart wing members or the wing portion can be a single member which extends completely around the tool axis. The notch is formed by rotating the tool and moving the tool in a direction along a radius of the wafer until the wing portion contacts the wafer and forms a rounded intersection between the notch and the wafer perimeter in the shape of the intersection of the rounded tip portion and the wing of the tool.

12 Claims, 2 Drawing Sheets

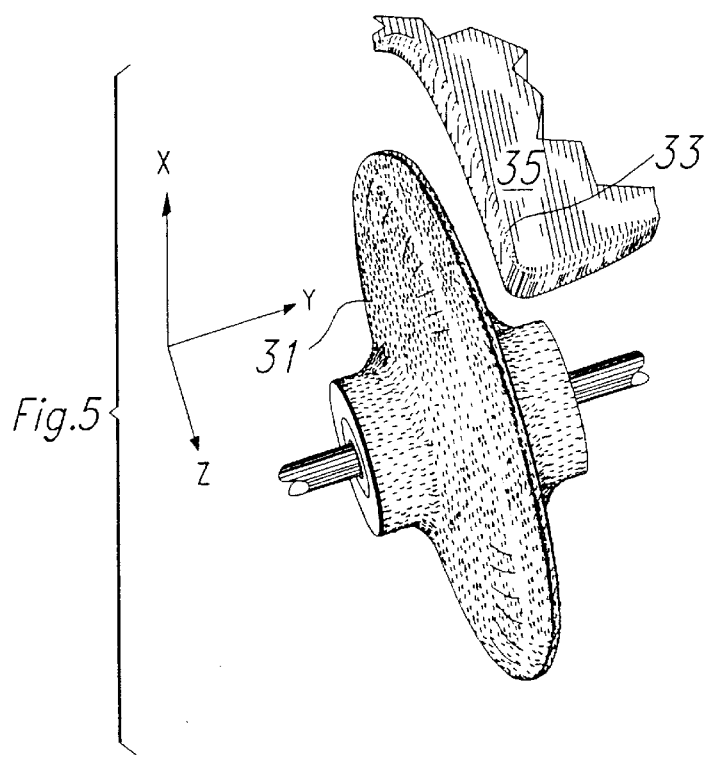
Fig.5
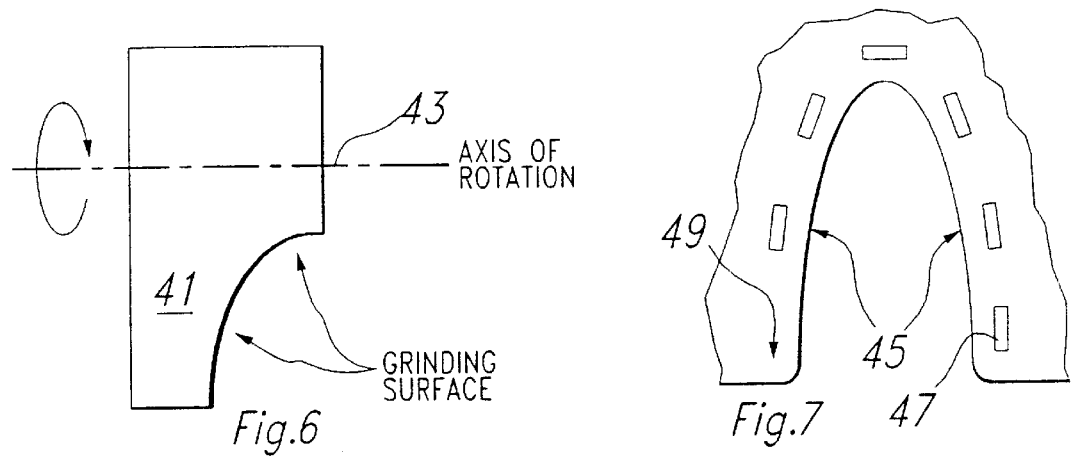
Fig.6
Fig.7
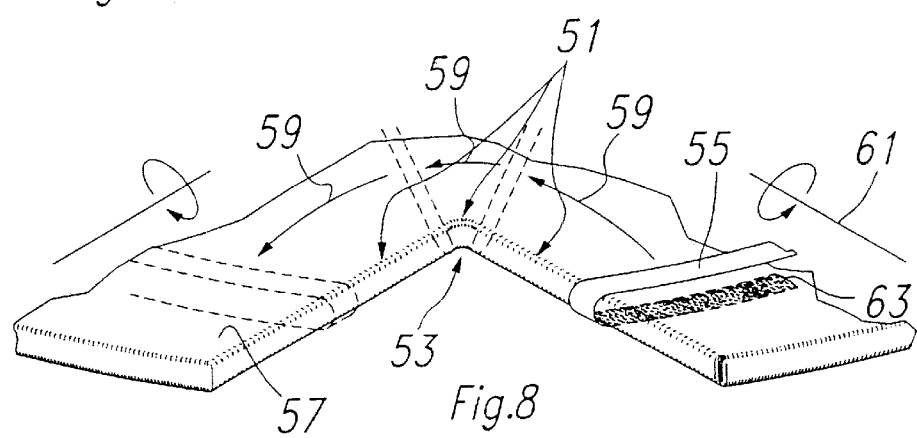
Fig.8

METHOD FOR PRODUCING WAFER NOTCHES WITH ROUNDED CORNERS AND A TOOL THEREFOR

This application is a division of Ser. No. 09/289,499 filed Apr. 9, 1999, now U.S. Pat. No. 6,448,154 which claims priority from Provisional Application Serial No. 60/081,986 filed Apr. 10, 1998.

BACKGROUND OF THE INVENTION

1. Field of the Invention

This invention relates to a method producing wafers with rounded corners in the notch used for alignment for use in the fabrication of semiconductor devices and a tool for producing such wafers.

2. Brief Description of the Prior Art

The fabrication of semiconductor devices generally starts with a slice or wafer of semiconductor material on which the semiconductor devices are fabricated. Such wafers are generally thin in width and have a pair of surfaces with the corners at the perimeter of the wafer generally being rounded.

In order to properly align the semiconductor wafers in processing equipment during the fabrication of semiconductor devices on the wafers, it has been necessary to provide a physical indication on the wafer to assist in such wafer alignment. The general such physical indication in the prior art has been formation of a flat end portion on the otherwise circular wafer with this indication more recently having been changed to a triangularly-shaped or parabolically-shaped notch at the wafer perimeter. A problem with these forms of wafer alignment is that the flat or notch regions used for alignment generally have sharp corners, particularly in the case where notches are used. These sharp corners generate particles during handling which can have deleterious effects during subsequent processing operations. In addition, damage from sharp corners may propagate into the wafer during device fabrication, causing eventual breakage and yield diminution.

It has also been determined that there is often a thick resist buildup at the sharp corner made between the notch and the perimeter of the wafer which is difficult to remove by ashing and chemical treatment. To date, it has not been appreciated that the sharp edges or corners located in the notch contribute to the above problems and it is not known that there has been any attempt in the prior art to remove the sharp corners from the notch and the regions connected to the notch.

SUMMARY OF THE INVENTION

In accordance with the present invention, the above described problems of the prior art wafer and particularly such wafer using a notch for alignment are minimized and there is provided a method of fabricating semiconductor devices on a wafer having a notch for alignment and tools for effecting such method for minimization of the above described problem and rounding of the junction of the notch and wafer perimeter as well as the notch apex and edges of the notch running from the wafer perimeter to the notch apex.

Briefly, there are provided one or more tools in the form of a grinding wheel or belt which rounds all sharp edges or corners existing in the notch either when forming the notch or when altering the shape of an already existing notch to eliminate all sharp corners both at the apex of the notch as well as along all intersections of the walls of the notch with the planar wafer surface and also with the perimeter of the wafer. Conventional stress relief etching in hydrogen fluoride plus nitric acid plus phosphoric acid or other suitable acidic solutions enhances notch corner rounding. In such a solution, rounding occurs as a normal consequence of etching both the top and side surfaces, the corners etching faster by virtue of being exposed to a greater volume of etchant. A wafer having a notch with rounded corners reduces the likelihood of edge damage during wafer handling due to flat finding, wafer centering, etc., prevents thick resist buildup at corners of the notch during photolithography, eliminates particle contamination from resist buildup at sharp notch corners and reduces ash time required to remove thick resist buildup.

The grinding tool provided in accordance with the present invention has a rounded front end somewhat in the shape of half of a paraboloid. The tool is formed of a material which is harder than the material of which the wafer is made. Generally, the grinding surface of the tool is fabricated from diamond with an approximate 800 mesh grit. The tool also includes one or more wing portions extending outwardly from the paraboloid surface and set back from the tool front tip a distance generally equal to the ultimate depth of the notch from the wafer perimeter. The wing is tapered in the direction toward the tool front tip. In the case of a single wing, such wing can extend completely around the entire tool or can extend only partially around the tool. The tool is rotated it axis which is the major axis of the paraboloid and moved against the edge of the wafer in a direction along a radius of the wafer either in a predetermined location on the wafer edge or into a previously formed notch in the wafer perimeter. The tool will grind away the wafer to form a notch until the wing or wings contact the perimeter of the wafer. At that point, the tool will grind the corner made between the notch and the wafer perimeter into the shape of the round on the tool between the paraboloid portion of the tool and the wing portion of the tool, this being rounded. A second grind step is optionally provided at this time using an identically shaped wheel with finer grit size to remove surface damage, if desired. A third grind step may be provided in order to round the top edge of the wafer along the intersection of the edge of Th. notch with the top and/or bottom planar surfaces of the wafer. Examples are grinding this surface using a cylindrical grinding wheel rotating against the edge or using a long belt with diamond grit on its interior surface that revolves about an axis parallel to the top wafer surface. The tool is then removed with the wafer now ready for processing in standard manner.

BRIEF DESCRIPTION OF THE DRAWINGS

FIG. 5 is a schematic diagram showing a second type of grinding tool which can be used in accordance with the present invention;

FIG. 6 is a schematic diagram showing a third type of grinding tool which can be used in accordance with the present invention;

FIG. 7 is a schematic diagram showing the trajectory along the notch of the grinding wheel of FIG. 6; and FIG. 8 is a schematic diagram of a fourth type of grinding tool which can be used in accordance with the present invention.

DESCRIPTION OF THE PREFERRED EMBODIMENTS

Figure 1:
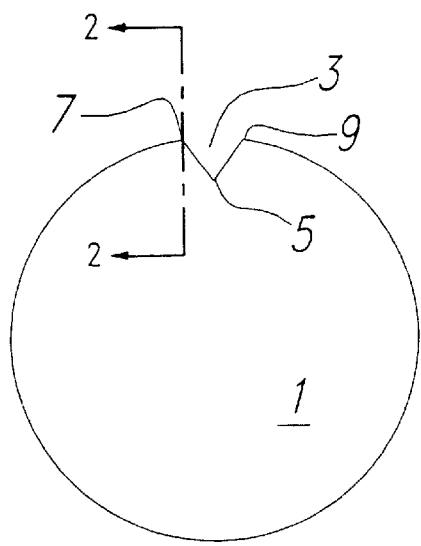
FIG. 1 is a top view of a typical prior art wafer having a notch therein for alignment.
Figure 2:
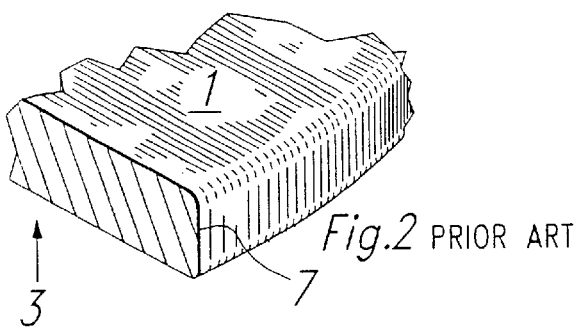
FIG. 2 is a view taken along the line 2—2 of FIG. 1.

Referring to FIGS. 1 and 2, there is shown in typical prior art wafer 1 having a notch 3 therein. While the perimeter of the wafers in FIGS. 1 and 2 as well as in FIGS. 3 and 4 which are described hereinbelow are shown to have sharp corners, it should be understood that the wafers are generally purchased with the corners along the perimeter away from the notch or flat rounded or these corners are rounded before commencement of fabrication of semiconductor device on the wafer. As can be seen, there are sharp corners at the apex 5 of the notch, at the intersections 7, 9 of the notch with the outer edge of the wafer and at the intersections of the notch with the upper and lower surfaces or opposing major surfaces of the wafer. These corners cause the problems enumerated above and often result in resist buildup, especially on the surface of the wafer on which device fabrication is taking place and where a sharp corner exists, particularly at locations 7, 9.

Figure 4:
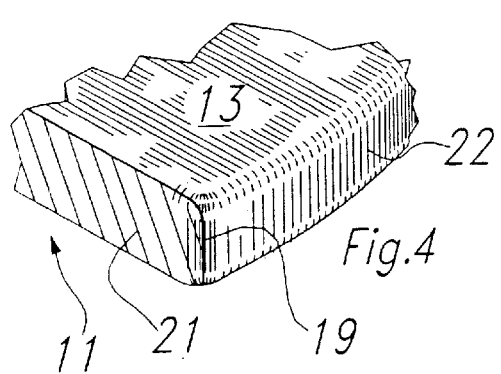
FIG. 4 is an enlarged view of the rounded corner formed by use of the tool of FIG. 3.
Figure 3:
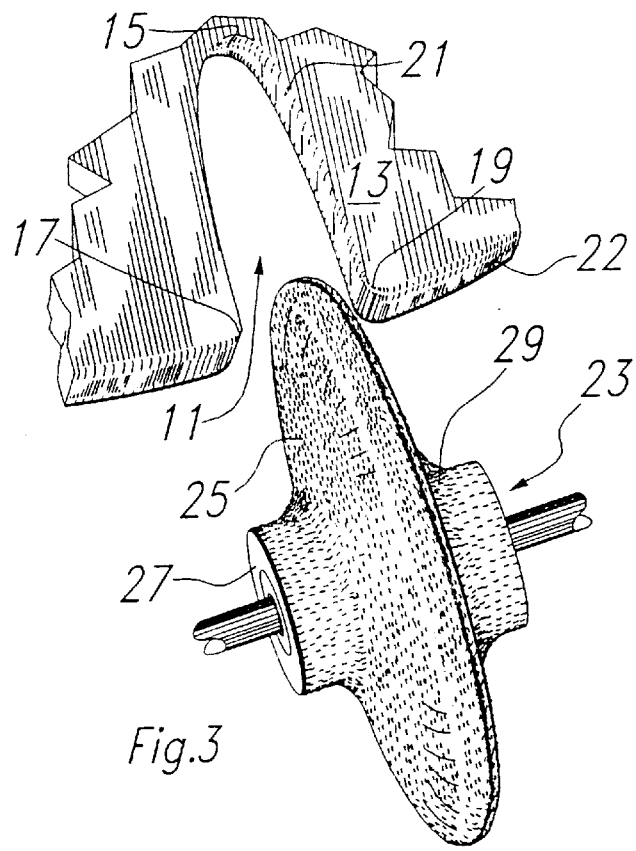
FIG. 3 is a perspective view of a tool in accordance with the present invention which has just ground a notch in accordance with the present invention.

Referring to FIGS. 3 and 4, there is shown a notch 11 formed in a semiconductor wafer 13 in accordance with the present invention. The apex 15 of the notch 11 as well as the junctions 17 and 19 of the side walls 21 of the notch are rounded. Accordingly, there are no sharp edges with the wafer outer edge or perimeter 22 to break off or to cause damage to the wafer during handling.

The rounded corners are formed by use of a grinding tool 23 as shown in FIG. 3 which is formed of a mesh of diamond grit or other hard material and which has a rounded or paraboloidally shaped nose portion 25. Spaced backward from the front tip of the nose portion 25 are one or more wings 27 having a tapered portion 29 in the direction of the front tip of the nose portion. The distance between the front tip of the nose portion 25 and the forwardmost portion of the wing or wings 27 is about the depth of the notch 11 which is formed by the tool. The rounded corners 17, 19 are formed by and take the shape of the tapered portion 29 of the wing or wings 27. Though two wings 27 are shown, it should be understood that one or more wings can be used and that the width of the wings in a direction around the tool axis can be anything from a small fraction of the total circumference about the tool axis to the entire circumference about the tool axis.

Referring to FIG. 5, there is shown a grinding tool 31 that can be used in accordance with the present invention for grinding the sharp corners 33 of a wafer 35. The grinding tool 31 is shown in the form of a wheel and is translated toward the wafer surface in the z-direction and then along an appropriate path in the x- and y-directions to follow the complete wafer edge trajectory. The z-position and wheel tilt can be adjusted as the wheel moves farther from the notch edge (increase in y value) to produce a gradual edge rounding instead of an abrupt rounding. The wheel position is moved to follow the trajectory of the notch along its entire extent, Both top and bottom notch corners can be smoothed in this way. A second step grinding can be provided with a finer grit wheel for reduction in mechanical damage.

Referring to FIG. 6, there is shown a further embodiment of a grinding wheel 41 which rotates about the axis of rotation 43. This grinding wheel allows the top edge rounding to be accomplished by maintaining the wheel without tilt or z-motion by simply translating the wheel around the notch perimeter 45 from the starting position 47 in the direction of the arrow 49 as shown in FIG. 7.

Referring to FIG. 8, there is shown a still further embodiment of a system for rounding the sharp edges 51 of the notch 53. There is shown a belt 55 which extends above and below the wafer 57 so that it contacts the two sharp edges in the notch 53. The interior surface 63 of the belt 55 has a diamond grit embedded therein. The belt 55 is moved around the notch in the direction of the arrows 59 with the belt rotating about its axis 61. As the belt 55 is moved around the notch 53, the belt also rotates about the axis 61 which is also moving with the belt. The belt interior surface 63 impinges against the corners or sharp edges 51 with the surface thereof which contains the grit, thereby grinding away and rounding the sharp edge. As in the prior embodiment, a subsequent stop can be a repeat of the grinding process with a belt having a finer grit.

It can be seen that there has been provided a tool which forms a notch in a semiconductor wafer having rounded corners for purposes alignment during semiconductor fabrication. There is also provided the notch which has the rounded corners.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A tool for forming rounded corners in a semiconductor wafer for use in the fabrication of semiconductor devices, which comprises:

(a) a body of a material having a hardness greater than said semiconductor wafer, said body having:
      (i) a generally rounded or parabolically shaped nose portion having a forwardmost tip portion defining the perimeter of a generally circular cross section; and
      (ii) a wing portion extending rearwardly of said tip portion and then extending outwardly from said body in a direction substantially conformal to said wafer when said cross section is disposed along a radius of said wafer, said wing portion having a taper narrowing in the direction of said forwardmost tip portion.

2. The tool of claim 1 wherein said wing portion includes a plurality of spaced apart wing members.

3. The tool of claim 1 wherein said body has a major axis and said wing portion extends completely around said axis.

4. The tool of claim 1 wherein said rounded front portion is in the shape of a paraboloid.

5. The tool of claim 4 wherein said wing portion includes a plurality of spaced apart wing members.

6. The tool of claim 4 wherein said body has a major axis and said wing portion extends completely around said axis.

7. The tool of claim 1 wherein said body is formed of a material taken from the class consisting of silicon carbide and diamond.

8. The tool of claim 7 wherein said wing portion includes a plurality of spaced apart wing members.

9. The tool of claim 7 wherein said body has a major axis and said wing portion extends completely around said axis.

10. The tool of claim 7 wherein said rounded front portion is in the shape of a paraboloid.

11. The tool of claim 10 wherein said wing portion includes a plurality of spaced apart wing members.

12. The tool of claim 10 wherein said body has a major axis and said wing portion extends completely around said axis.

* * * * *